United States Patent
Srinivasan et al.

(10) Patent No.: US 9,638,756 B2
(45) Date of Patent: May 2, 2017

(54) LOAD CELL RESIDUAL FATIGUE LIFE ESTIMATION SYSTEM AND METHOD

(71) Applicant: HONEYWELL INTERNATIONAL INC., Morristown, NJ (US)

(72) Inventors: Sivasubramanian Srinivasan, Karnataka (IN); Sivaprakash Eswaran, Karnataka (IN); Gautham Ramamurthy, Karnataka (IN); Sudheer Beligere, Karnataka (IN); Alan John Kempainen, Ostrander, OH (US)

(73) Assignee: Honeywell International Inc., Morris Plains, NJ (US)

( * ) Notice: Subject to any disclaimer, the term of this patent is extended or adjusted under 35 U.S.C. 154(b) by 1177 days.

(21) Appl. No.: 13/710,618

(22) Filed: Dec. 11, 2012

(65) Prior Publication Data

US 2014/0163909 A1 Jun. 12, 2014

(51) Int. Cl.
*G01R 31/36* (2006.01)
*G01G 23/01* (2006.01)
*G01L 25/00* (2006.01)
*G01D 1/14* (2006.01)
*G01D 3/08* (2006.01)

(52) U.S. Cl.
CPC .............. *G01R 31/36* (2013.01); *G01D 1/14* (2013.01); *G01D 3/08* (2013.01); *G01G 23/01* (2013.01); *G01L 25/00* (2013.01)

(58) Field of Classification Search
None
See application file for complete search history.

(56) References Cited

U.S. PATENT DOCUMENTS

| | | | |
|---|---|---|---|
| 4,336,595 A | 6/1982 | Adams et al. | |
| 6,480,792 B1 | 11/2002 | Prendergast | |
| 6,576,849 B2 * | 6/2003 | Bliss ................ | G01G 23/3735 177/199 |

(Continued)

FOREIGN PATENT DOCUMENTS

WO 2009132281 A1 10/2009

OTHER PUBLICATIONS

Europe Patent Application No. 13193213, European Search Report, mailed Jul. 4, 2016, 4 pages.

(Continued)

*Primary Examiner* — Aditya Bhat
(74) *Attorney, Agent, or Firm* — Conley Rose, P.C.; Kristin Jordan Harkins

(57) ABSTRACT

A system and method for estimating the residual fatigue life of a load cell includes storing, in a memory, fatigue life reference data associated with a test load cell. A predetermined number of data storage bins are provided. Each data storage bin is representative of a predefined value range of peak loads. Peak loads applied to an in-service load cell are detected, and each is stored in an appropriate one of the data storage bins. A number of load cycles of the in-service load cell are calculated based on the detected peak loads stored in each of the data storage bins. An estimate of the residual life of the in-service load cell is calculated from the fatigue life reference data and the calculated number of load cycles of the in-service load cell.

19 Claims, 10 Drawing Sheets

(56) References Cited

U.S. PATENT DOCUMENTS

| | | | |
|---|---|---|---|
| 7,211,748 B2* | 5/2007 | Lauke | G01G 3/147 |
| | | | 177/199 |
| 7,433,789 B1 | 10/2008 | Balestra | |
| 7,454,297 B2 | 11/2008 | Balestra | |
| 7,908,928 B2 | 3/2011 | Vik et al. | |
| 7,953,559 B2 | 5/2011 | Sundermeyer et al. | |
| 2004/0044499 A1 | 3/2004 | House et al. | |
| 2008/0140361 A1 | 6/2008 | Bonissone et al. | |
| 2008/0208487 A1 | 8/2008 | Goebel et al. | |
| 2010/0299085 A1 | 11/2010 | Slycke et al. | |
| 2010/0332153 A1 | 12/2010 | Vegter et al. | |
| 2011/0054840 A1 | 3/2011 | Hively et al. | |
| 2012/0029839 A1 | 2/2012 | Ritter et al. | |

OTHER PUBLICATIONS

Europe Patent Application No. 13193213, European Search Report, mailed Aug. 1, 2016, 5 pages.

* cited by examiner

LOAD CELL RESIDUAL FATIGUE LIFE ESTIMATION SYSTEM AND METHOD

TECHNICAL FIELD

The present invention generally relates to load cells, and more particularly relates to residual fatigue life estimation systems and methods for load cells.

BACKGROUND

Load cells are used in myriad industries and environments. For example, the automotive, aerospace, and oil and gas industries are just a few that use these devices. Typically, load cells are used to provide feedback regarding platform stabilization, monitoring of operating loads, etc. When a load cell becomes inoperable due, for example, it coming to the end of its useful life, the feedback it provides becomes interrupted, which can impact overall system availability. Hence, providing prognostic feedback to a user regarding the residual life of the load cell would be desirable, as this could avoid breakdown maintenance and improve system availability.

During typical load cell operation, the load peaks and the duration of each load cycle applied to a load cell may vary randomly. The ability to predict the residual life of a load cell based on the cumulative effect of such randomly varying load peaks and corresponding number of cycles presents a potentially significant challenge. Moreover, the estimated residual life should be tracked throughout the life of the load cell and made available whenever a user makes a query for this information. These challenges and desires have, to date, inhibited providing a solution.

Hence, there is a need for a system and method that provides feedback to a user regarding the residual life of the load cell, based on the cumulative effect of randomly varying load peaks and load cycles, throughout the life of the load cell, and be made available whenever a user makes a query for this information. The present invention addresses at least these needs.

BRIEF SUMMARY

In one embodiment, a method for estimating the residual fatigue life of a load cell includes storing, in a memory, fatigue life reference data associated with a test load cell. A predetermined number of data storage bins are provided. Each data storage bin is representative of a predefined value range of peak loads. Peak loads applied to an in-service load cell are detected, and each is stored in an appropriate one of the data storage bins. A number of load cycles of the in-service load cell are calculated based on the detected peak loads stored in each of the data storage bins. An estimate of the residual life of the in-service load cell is calculated from the fatigue life reference data and the calculated number of load cycles of the in-service load cell.

In another embodiment, a load cell residual fatigue life estimation system includes an in-service load cell, first memory, second memory, a first processor, and a second processor. The in-service load cell is adapted to have loads applied thereto and is configured, in response to the applied loads, to supply load cell output signals representative thereof. The first memory has stored therein fatigue life reference data associated with a test load cell. The second memory has stored therein a predetermined number of data storage bins, each data storage bin is representative of a predefined value range of peak loads applied to the in-service load cell. The first processor is coupled to receive the load cell output signals and is configured, upon receipt thereof, to detect peak loads applied to an in-service load cell and store each of the detected peak loads in an appropriate one of the data storage bins. The second processor is in operable communication with the first memory and the second memory and is configured to calculate a number of load cycles of the in-service load cell based on the detected peak loads stored in each of the data storage bins and calculate an estimate of the residual life of the in-service load cell from the fatigue life reference data and the calculated number of load cycles of the in-service load cell.

In still another embodiment, a load cell includes a sensor, memory, and a processor. The sensor is adapted to have loads applied thereto and is configured, in response to the applied loads, to supply output signals representative of the applied load. The memory has stored therein a predetermined number of data storage bins, each data storage bin is representative of a predefined value range of peak loads applied to the in-service load cell. The processor is coupled to receive the output signals and is configured, upon receipt thereof, to detect peak loads applied to an in-service load cell and store each of the detected peak loads in an appropriate one of the data storage bins.

Furthermore, other desirable features and characteristics of the load cell residual life estimation system and method will become apparent from the subsequent detailed description and the appended claims, taken in conjunction with the accompanying drawings and the preceding background.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. As used herein, the word "exemplary" means "serving as an example, instance, or illustration." Thus, any embodiment described herein as "exemplary" is not necessarily to be construed as preferred or advantageous over other embodiments. All of the embodiments described herein are exemplary embodiments provided to enable persons skilled in the art to make or use the invention and not to limit the scope of the invention which is defined by the claims. Furthermore, there is no intention to be bound by any expressed or implied theory presented in the preceding technical field, background, brief summary, or the following detailed description.

Figure 1:
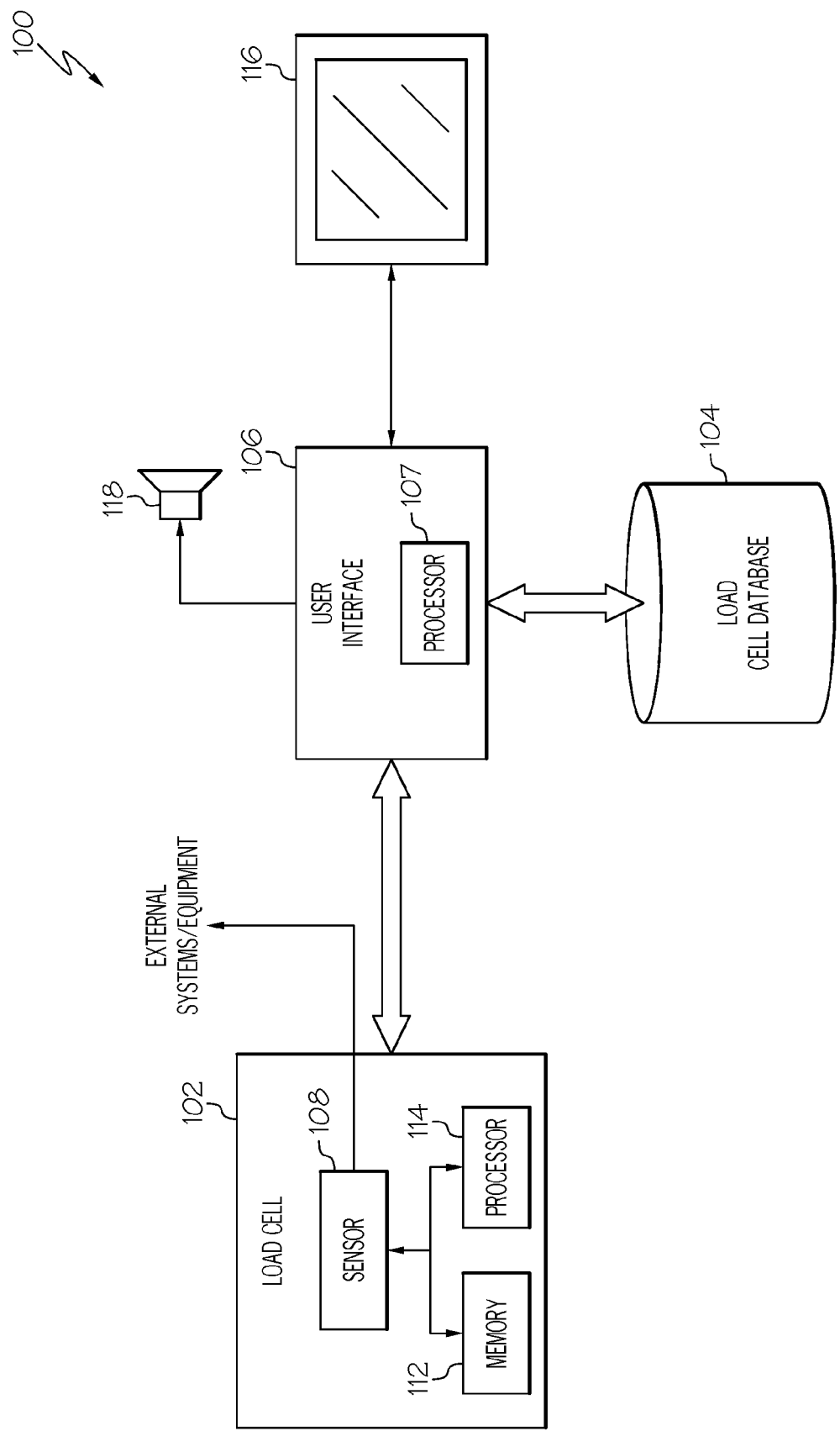
FIG. 1 depicts a functional block diagram of one embodiment of a load cell residual fatigue life estimation system.

Referring first to FIG. 1, a functional block diagram of a load cell residual fatigue life estimation system 100 is depicted, and includes a load cell 102, a load cell database 104, and a user interface 106. The load cell 102 is referred to herein as an in-service load cell, as contrasted with a test load cell. As will be described further below, one or more test load cells are used to generate fatigue life reference data during, for example, laboratory testing. The in-service load cell 102 is adapted to have loads applied thereto and is configured, in response to the applied loads, to supply load cell output signals representative thereof to various non-illustrated external equipment/systems. The in-service load cell 102 may be implemented using any one of numerous types of load cells now known or developed in the future for implementing the described functionality.

To implement the above-described functionality, the in-service load cell 102, at least in the depicted embodiment, includes a sensor 108, on-board memory 112, and an on-board processor 114. It will be appreciated that this is merely exemplary of one embodiment, and that the memory 112, the processor 114, or both, could be disposed remotely from the sensor 108. In any case, the sensor 108 is configured to generate and supply the load cell output signals in response to the applied loads. The particular type of sensor 108 that is used to implement the load cell 102 may vary, and may be any one of numerous types of sensors 108, now known or developed in the future.

The on-board memory 112, which may be implemented using any one of numerous types of memory devices, is configured to have a predetermined number of data storage bins stored therein. As will also be described further below, each data storage bin is representative of a predefined value range of peak loads that may be applied to the in-service load cell 102.

The on-board processor 114 is in operable communication with the sensor 108 and the on-board memory 112. The on-board processor 114 is coupled to receive the load cell output signals supplied by the sensor 108, and is configured, upon receipt of the load cell output signals, to implement various functions. The functions implemented by the on-board processor 114 include detecting peak loads applied to the in-service load cell 108, storing each of the detected peak loads in an appropriate one of the data storage bins in the on-board memory 112, and calculating a number of load cycles of the in-service load cell 108 based on the detected peak loads stored in each of the data storage bins. The specific manner in which the on-board processor 114 implements these functions will be described in more detail further below.

The load cell database 104 has fatigue life reference data stored therein. The fatigue life reference data, as will be described further below, is fatigue life data associated with the previously mentioned test load cell (not depicted). Although the load cell database 104 is depicted in FIG. 1 as being implemented separate from the in-service load cell 102 and the user interface 106, it will be appreciated that this is merely done for illustrative purposes, and that the load cell database 104 is preferably stored within the user interface 106. It will additionally be appreciated that in other embodiments, the on-board memory 112 and the fatigue life database 104 could, if needed or desired, be implemented together in a single memory, which could be implemented as part of the in-service load cell 102 or as part of the processor 106.

The user interface 106 may be selectively placed in operable communication with the in-service load cell 102 and is configured to calculate an estimate of the residual life of the in-service load cell 102. In particular, the user interface 106 is configured to selectively retrieve fatigue life reference data from the load cell database 104 and the calculated number of load cycles of the in-service load cell 102 from the on-board memory 112. The user interface 106 is further configured, upon retrieval of these data, to calculate the residual life estimate of the in-service load cell 102. As FIG. 1 further depicts, the user interface 106 may render the residual life estimation on a display device 116, which may be an integral part of the user interface 106. The user interface 106 may also selectively generate an annunciation signal that causes an annunciator 118 to generate an alert, which may be audible, visual, haptic, or various combinations thereof. It will be appreciated that the user interface 106 may be variously implemented. For example, it may be implemented as a portable computer (e.g., laptop, notebook, etc.), a desktop computer, as part of the external equipment/system to which the in-service load cell 102 is connected, or as part of the in-service load cell 102 itself. No matter its specific implementation, and as FIG. 1 further depicts, the user interface 106 preferably includes a processor 107 that is configured to implement the functionality of the user interface 106.

Figure 2:
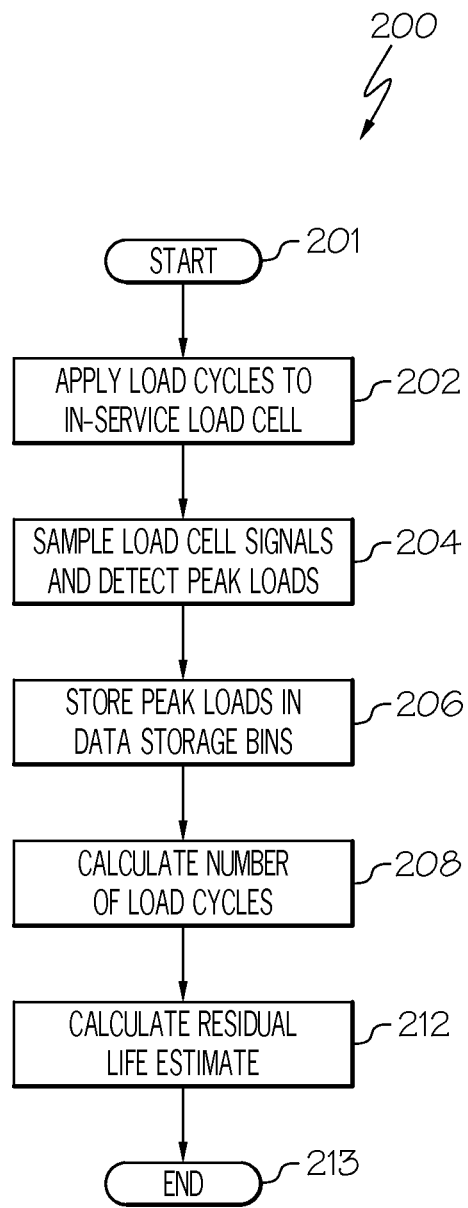
FIG. 2 depicts, in flowchart form, an overall methodology implemented by the system of FIG. 1 for estimating the residual life of a load cell.

Referring now to FIG. 2, the overall methodology implemented by the system 100 of FIG. 1 to carry out the above-described function will now be described. In doing so, it is noted that the parenthetical reference numerals in this description are used to reference the methodological steps depicted in FIG. 2. With this background in mind, it is seen that at least a portion of the overall methodology 200 is implemented while load cycles are being applied to the in-service load cell 102 (202). Specifically, as load cycles are being applied, the on-board processor 114 samples the load cell signals supplied from the sensor 108 and, based on the samples, detects the applied peak loads (204). The on-board processor 114 stores each of the detected peak loads in an appropriate one of the data storage bins in the on-board memory 112 (206). The on-board processor 114 then calculates the number of load cycles of the in-service load cell 102 based on the detected peak loads stored in each of the data storage bins (208). Thereafter, if or when user interface 106 is in operable communication with the in-service load cell 102 and the load cell database 104, the residual life estimate of the in-service load cell 102 is calculated (212).

Before proceeding further, it is noted that the number of data storage bins that are provided for in the on-board memory 112 may vary. Moreover, the predefined value range of each data storage bin may vary. In the depicted embodiment, however, number of data storage bins is based on the load limit range of the in-service load cell 102 and the sampling resolution of the on-board processor 114. For example, if the loads applied to the in-service load cell are sampled with a resolution of a predetermined number of bits (e.g., N-number of bits), then the predefined value range of each data storage bin is the load limit range divided by the 2 raised to the power of the predetermined number of bits (e.g., $2^N$). Moreover, the predetermined number of data storage bins is equal to $2^N$. To provide a particular physical example, assume that the load range of the in-service load cell 102 is 100 pounds (e.g., −50 to +50 pounds), and the loads applied to the in-service load cell 102 are sampled with a resolution of 8-bits. In this case, the number of data storage bins will be 256 ($2^8$), and the predefined value range for each data storage bin will be 0.390625 (100/256).

Figure 3:
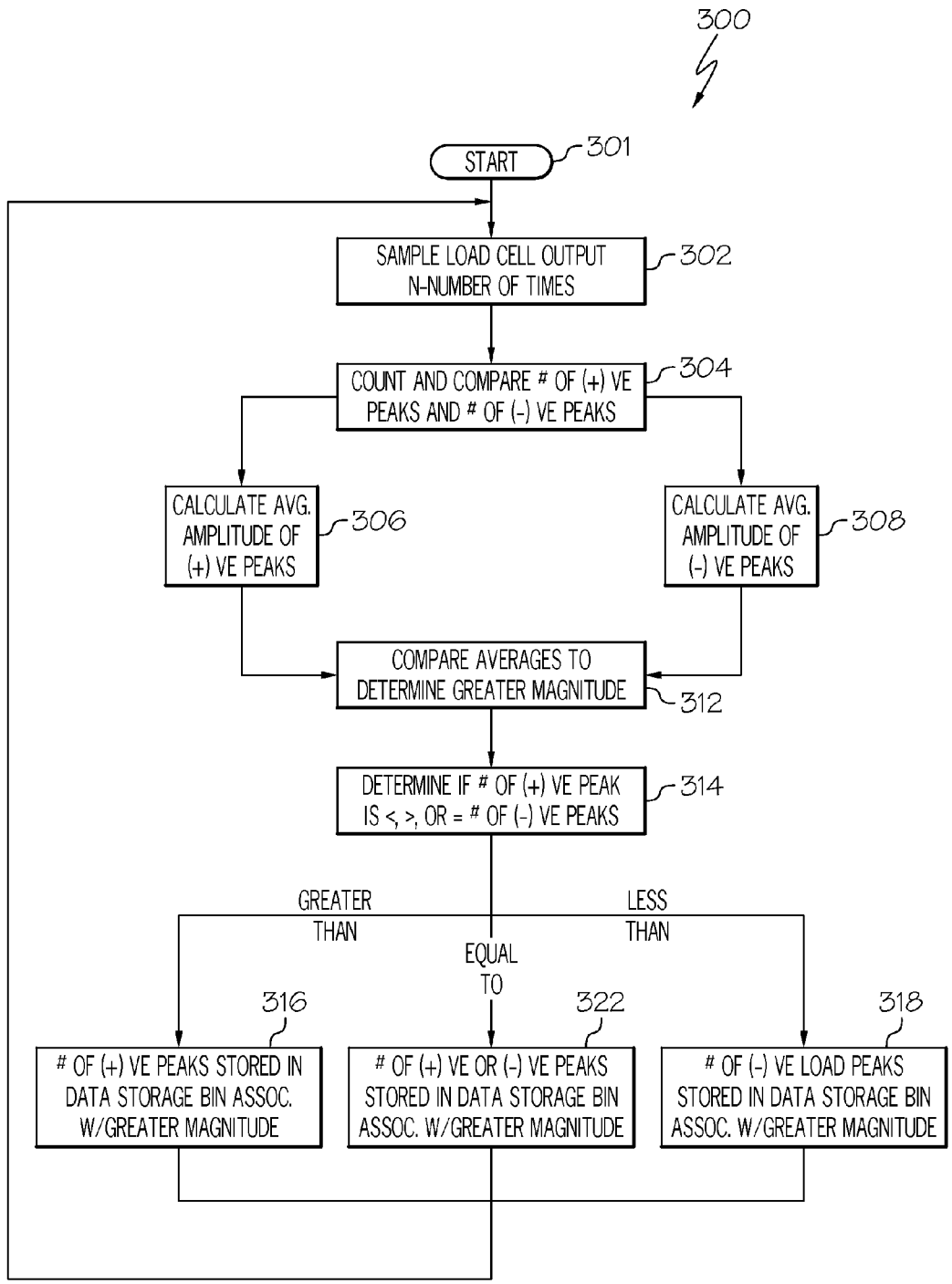
FIG. 3 depicts, in flowchart form, a portion of the general process depicted in FIG. 2.

Referring now to FIG. 3, a portion of the general process 200 described above and depicted in FIG. 2 will now be described in more detail. In particular, the specific manner with which the applied peak loads are detected, and how each of the detected peak loads is stored in a data storage bins will be described. As FIG. 3 depicts, the output of the in-service load cell 102 is sampled a predetermined number of times (302). In the depicted embodiment the predetermined number of times is 10. It will be appreciated, however, that this is merely exemplary of one embodiment and that other numbers may be used.

No matter the specific number of samples, the number of positive load peaks and the number of negative load peaks there are in the predetermined number of samples are counted and compared (304). It will be appreciated that the on-board processor 114 may use any one of numerous techniques to determine the number of positive and negative load peaks in the predetermined number of samples. In the depicted embodiment, however, the on-board processor 114 implements a peak detection technique. Before describing the methodology depicted in FIG. 3 any further, a particular preferred peak detection technique will first be described.

Figure 4:
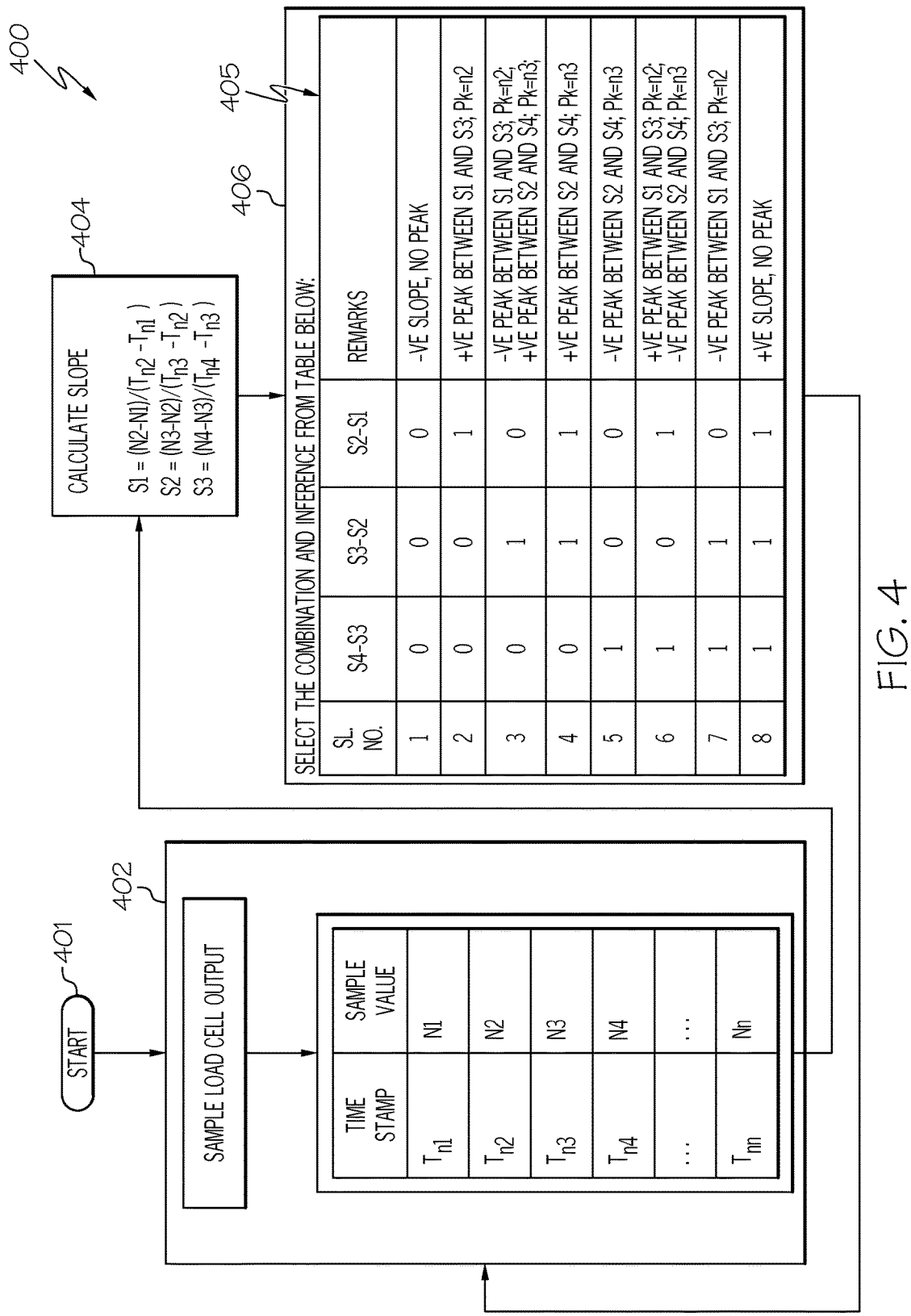
FIG. 4 depicts, in flowchart form, a process used to determine the number of positive and negative load peaks applied to a load cell.
Figure 5:
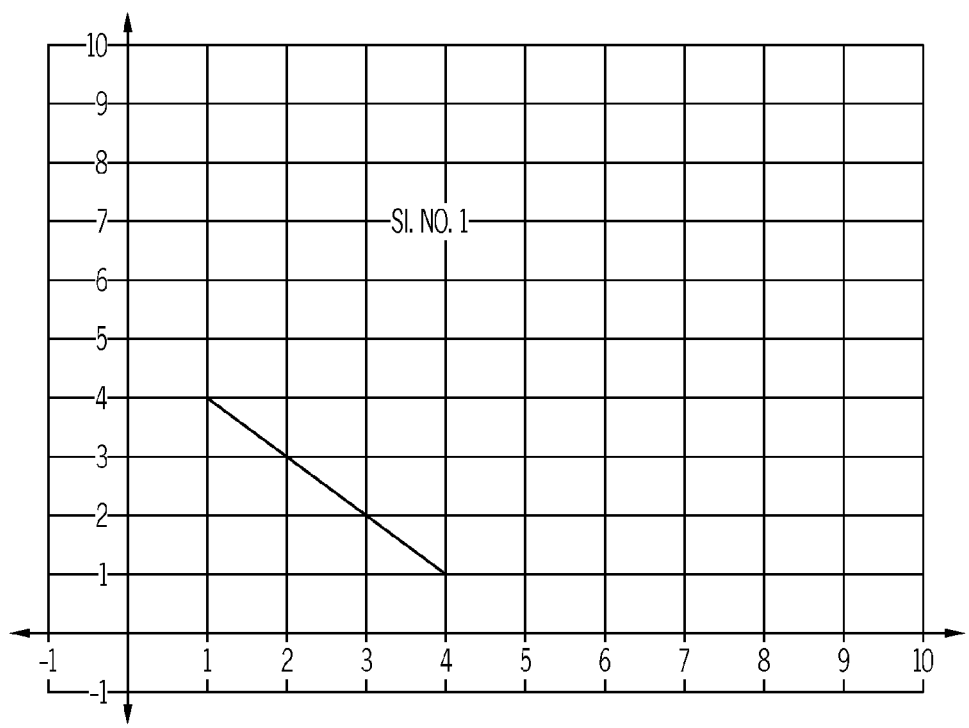
FIGS. 5-12 graphically depict different outcomes of the process depicted in FIG. 4.
Figure 6:
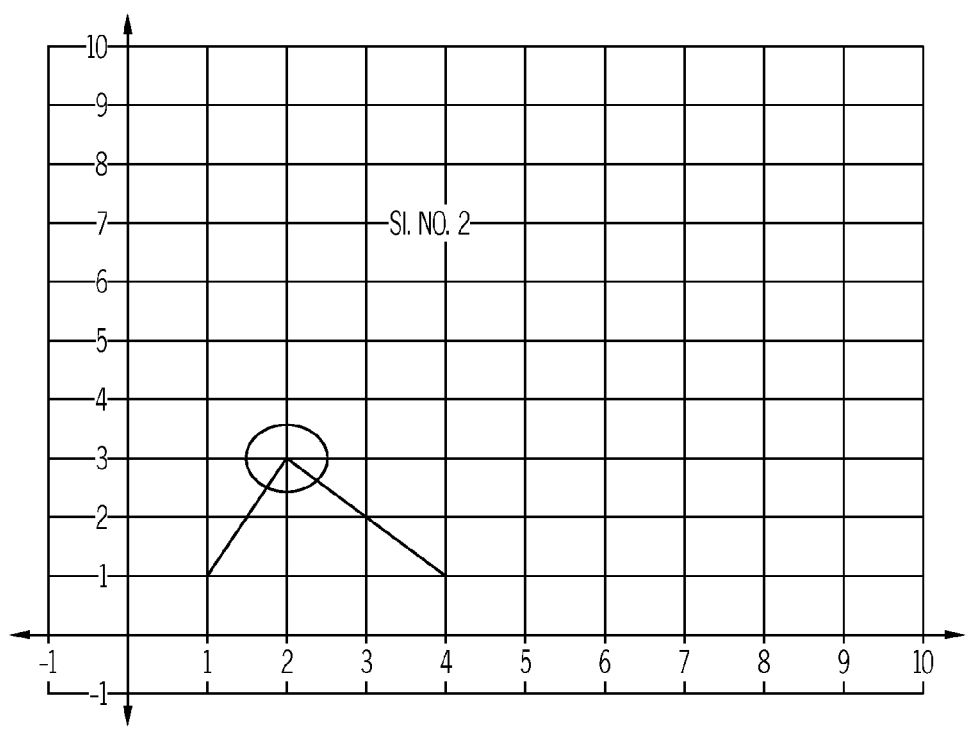
Figure 7:
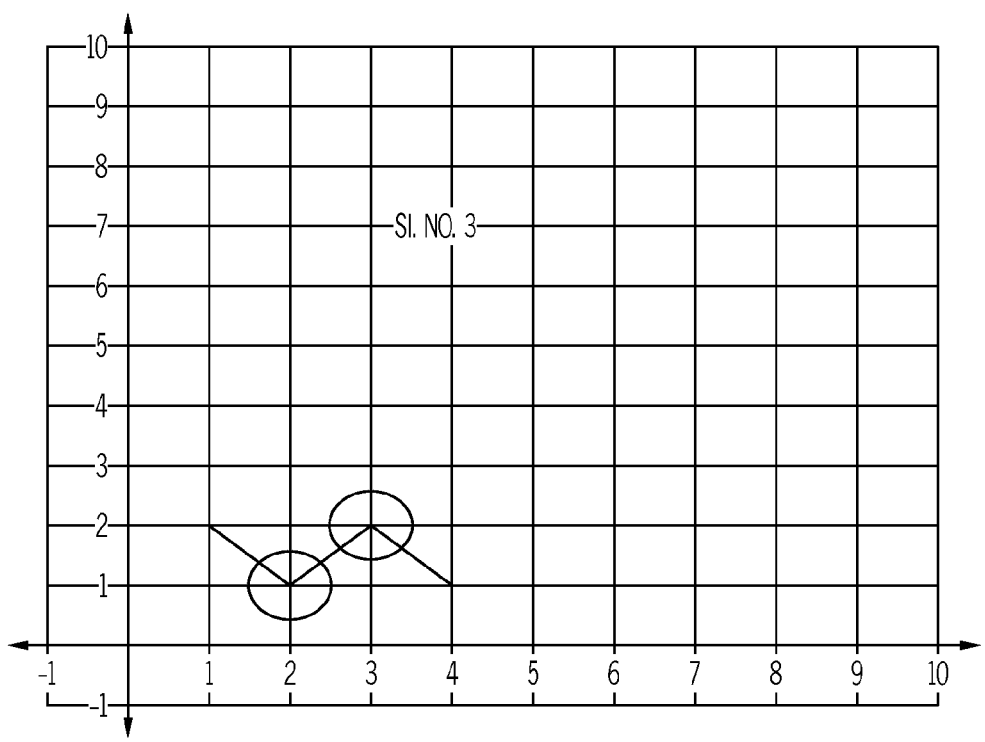
Figure 8:
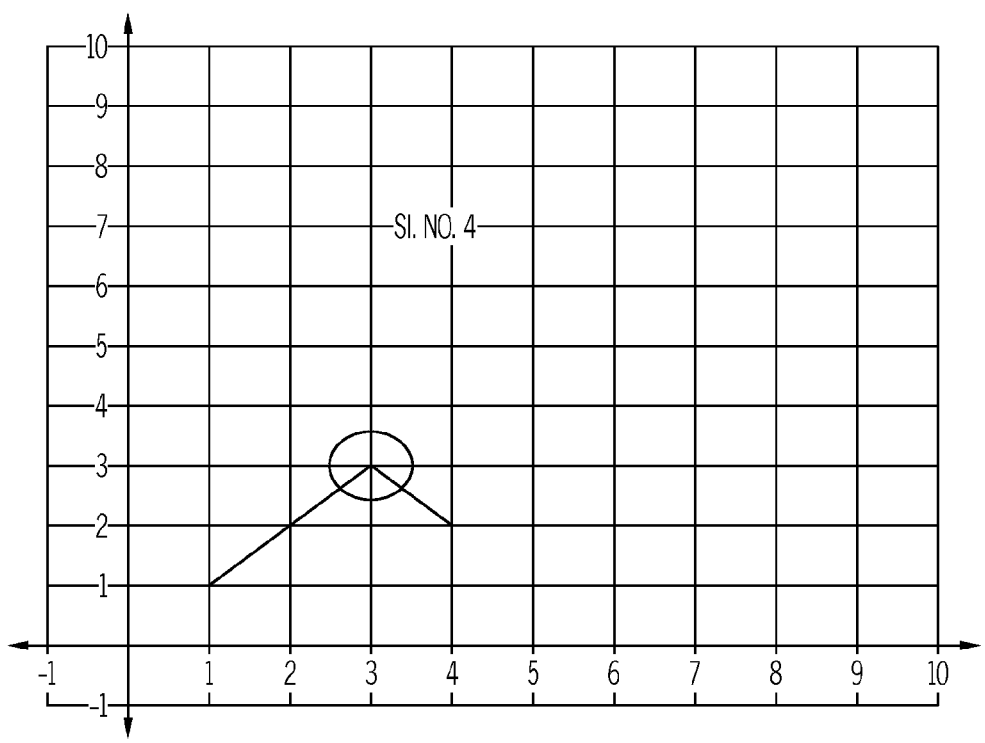
Figure 9:
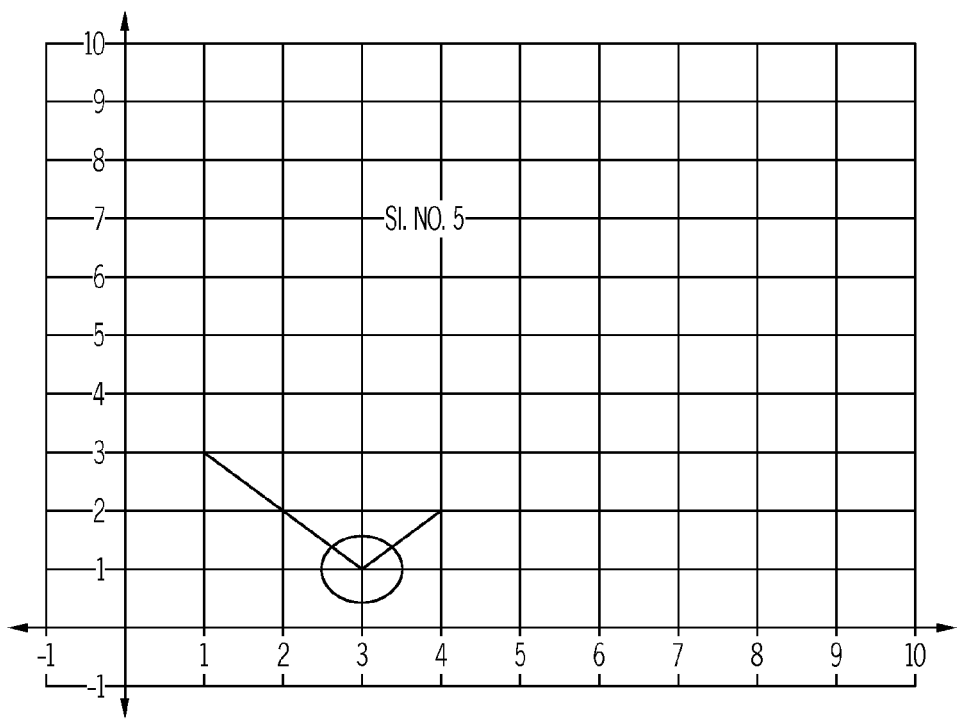
Figure 10:
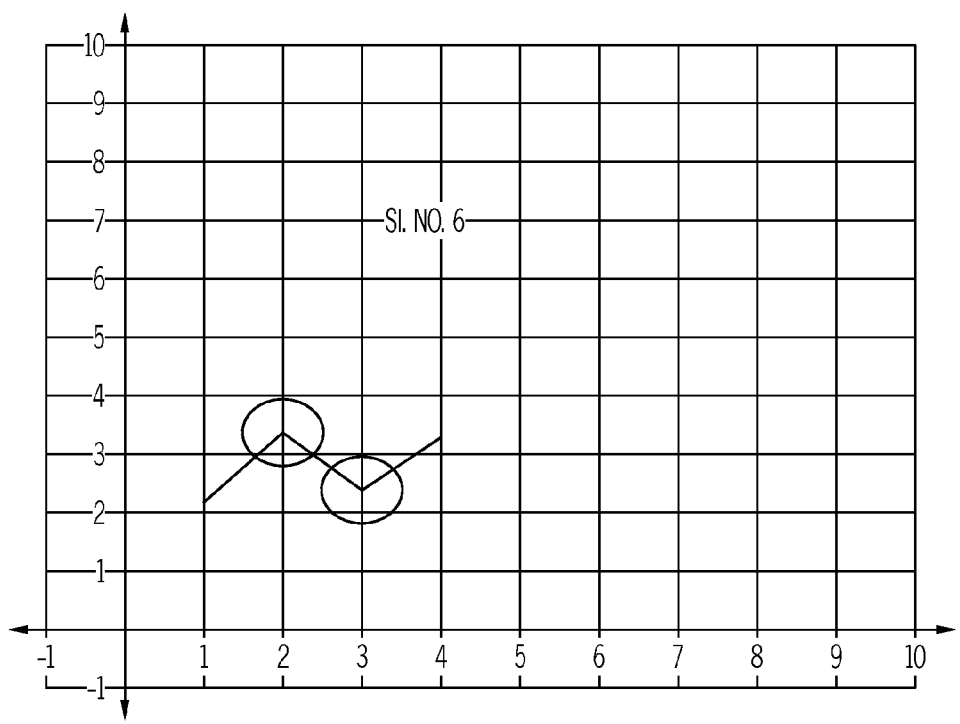
Figure 11:
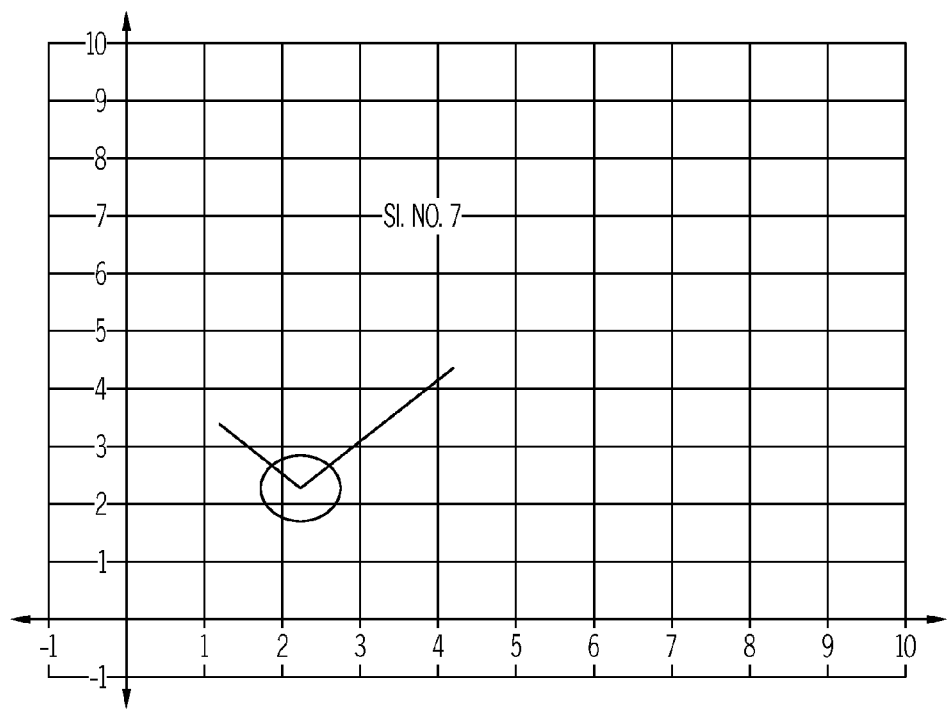
Figure 12:
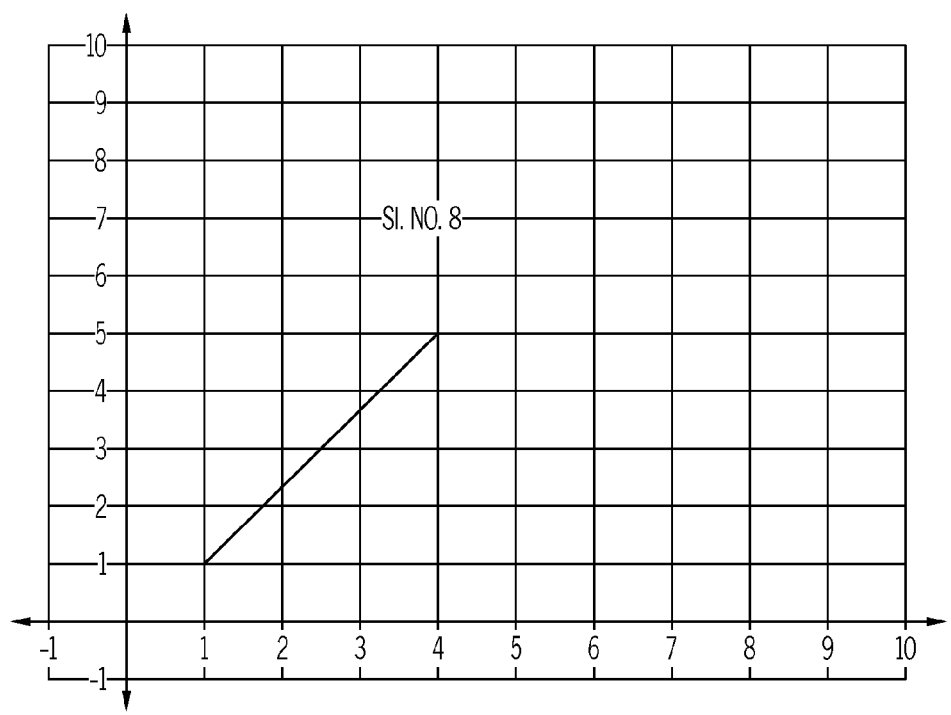

With reference to FIG. 4, it may be seen that the peak detection technique 400 uses a slope detection technique of the form of the following general slope equation:

$$S_n = \frac{(N_{n+1} - N_{n-1})}{(T_{n+1} - T_{n-1})},$$

where:
$S_n$=Slope at $n^{th}$ sample,
$N_{n+1}$=value of $(n+1)^{th}$ sample,
$N_{n-1}$=value of $(n-1)^{th}$ sample,
$T_{n+1}$=Time stamp of $(n+1)^{th}$ sample, and
$T_{n-1}$=Time stamp of $(n-1)^{th}$ sample.

More specifically, as the load cell output signals are sampled (402), three successive slopes, based on four successive load cell output signal samples, are calculated using the general slope equation above (404). The differences between successive ones of the calculated slopes are then calculated and used, based on an inference table (405), to determine if a positive peak (+ve), a negative peak (−ve), or no peak, is present (406). The inference table is also used to determine where the peak occurred (e.g., between which of the four samples) and the amplitude of the peak. It is noted that in the inference table (405), a difference of zero (0) between successively calculated slopes is considered a nullity, a difference that is positive is assigned a value of one (1), and a difference that is negative is assigned a value of zero (0). It is noted that because the inference table (405) is based on the differences between four successively calculated slopes (e.g., three difference calculations), it contains eight possible outcomes. Each of these outcomes, labeled "SI. No." in the inference table (405), is delineated in word form in the inference table (405) in FIG. 4 and, for clarity, each is also depicted graphically in FIGS. 5-12.

Returning now to FIG. 3, after the number of positive and negative load peaks (if any) are counted and compared, the average amplitude magnitude of the positive load peaks is calculated (306), and the average amplitude magnitude of the negative load peaks is calculated (308). The calculated average amplitude magnitudes are then compared (312) to determine which is greater. The determined number of positive load peaks or the determined number of negative load peaks are then selectively stored in the data storage bin associated with the greater magnitude average load peak. More specifically, the determined number of positive load peaks and the determined number of negative load peaks are compared (314) to determine which, if either, is greater. If the determined number of positive load peaks is greater than the determined number of negative load peaks, then the determined number of positive load peaks is stored in the data storage bin associated with the greater magnitude average load peak (316). Conversely, if the determined number of negative load peaks is greater than the determined number of positive load peaks, then the determined number of negative load peaks is stored in the data storage bin associated with the greater magnitude average load peak (318). As may be appreciated, if the determined number of positive load peaks and the determined number of negative load peaks are equal, then the determined number of positive load peaks or the determined number of negative load peaks is stored in the data storage bin associated with the greater magnitude average load peak (322). Thereafter, the next set of data samples are taken, and the process is repeated (302-322).

To provide an illustrative example of the above process steps, assume that the 10 load cell sampled data were: 0, 5, 10, 3, 10, 15, 5, 0, 6, and 3. This would result in a total of 5 load peaks being detected—3 positive peaks (at 10, 15, 6) and 2 negative peaks (at 3,0). The average of the positive peaks is 10.3333 (e.g., (10+15+6)/3), and the average of the negative peaks is 1.5 (e.g., (3+0)/2). Because the number of positive peaks (3) is greater than the number negative peaks (2), the number of cycles is 3, and the data storage load bin associated with 10.333 (because 10.3333>1.5) is incremented by 3. This conservatively assumes then that the in-service load cell 102 has undergone 3 cycles of peak-to-peak load value of 10.333.

Figure 13:
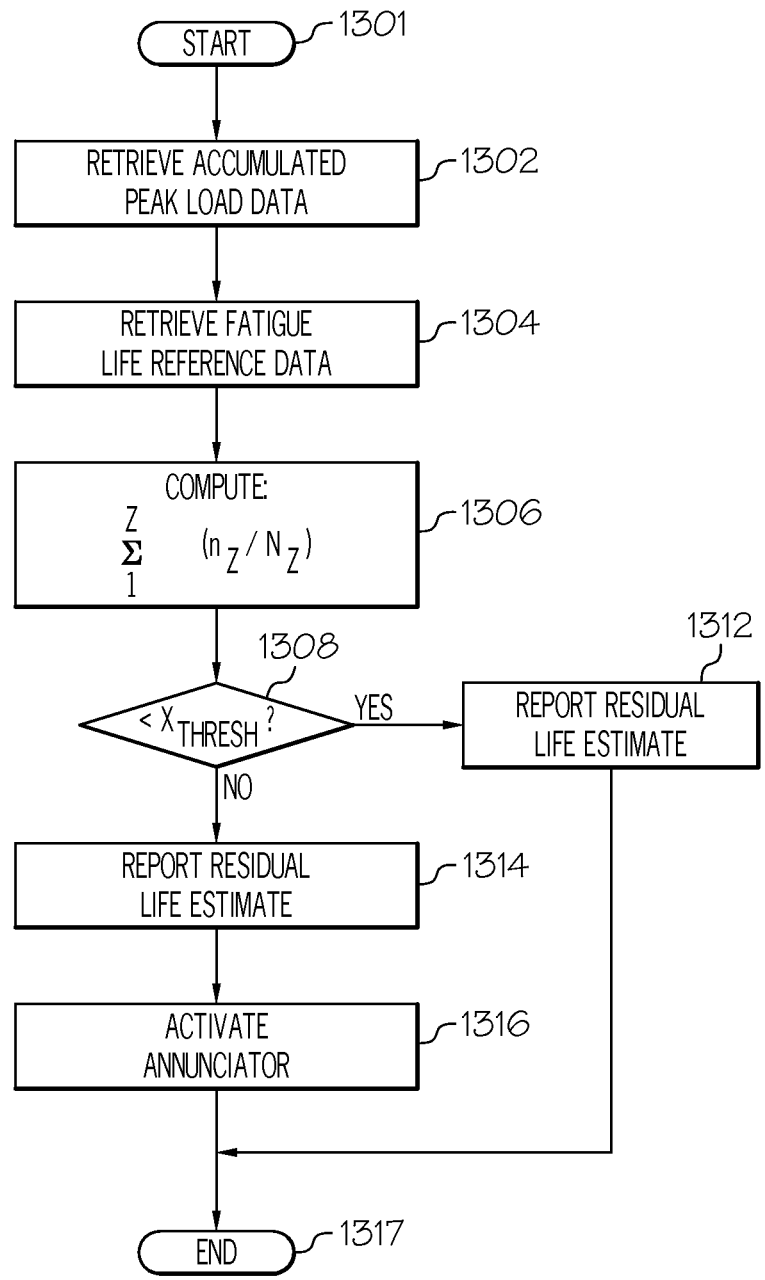
FIG. 13 depicts, in flowchart form, a process for calculating an estimate of the residual life of a load cell.

Referring now to the FIG. 13, a more detailed description of how the user interface 106 calculates an estimate of the residual life of the load cell 102 will be provided. Before doing so, however, it should be noted that the residual life estimate calculation may be variously implemented. In the depicted embodiment, however, this calculation is based on Minor's cumulative damage theory. According to this theory, the number of loading cycles is constant at a given stress level. Expressed mathematically, Minor's theory states:

$$\Sigma \sigma^n N = C,$$

where,
σ is the stress level,
n is a constant,
N is the number of cycles at the given stress level, and
C is a constant.

Turning now to the process 1300, the residual life estimate calculation uses the presently accumulated peak load data and the fatigue life reference data. Thus, as FIG. 13 depicts, the process 1300 begins by the processor 107 within the user interface 106 retrieving the accumulated peak load data for the in-service load cell 102 (1302) and the fatigue life reference data associated with this load cell type (1304). For each data storage bin, the ratio of the number of peak loads (e.g., $n_1, n_2, n_3, \ldots n_z$) to the number of cycles (e.g., $N_1, N_2, N_3, \ldots N_z$) to failure at each of the peak loads is calculated, and these ratios are summed (1306), as follows:

$$\Sigma \sigma_i^z (n_z/N_z).$$

The summed ratio is then compared to a threshold value ($X_{THRESH}$) (1308). If the ratio is less than the threshold, the residual life estimate is reported via, for example, the display 116 (1312). If the summed ratio exceeds the threshold value, the residual life estimate may be reported via, for example, the display 116 (1314), as well as annunciated via, for example, the annunciator 118 (1316). Though not depicted in FIG. 13, it will be appreciated that usage pattern information may also be generated and reported via, for example, the display 116.

Figure 14:
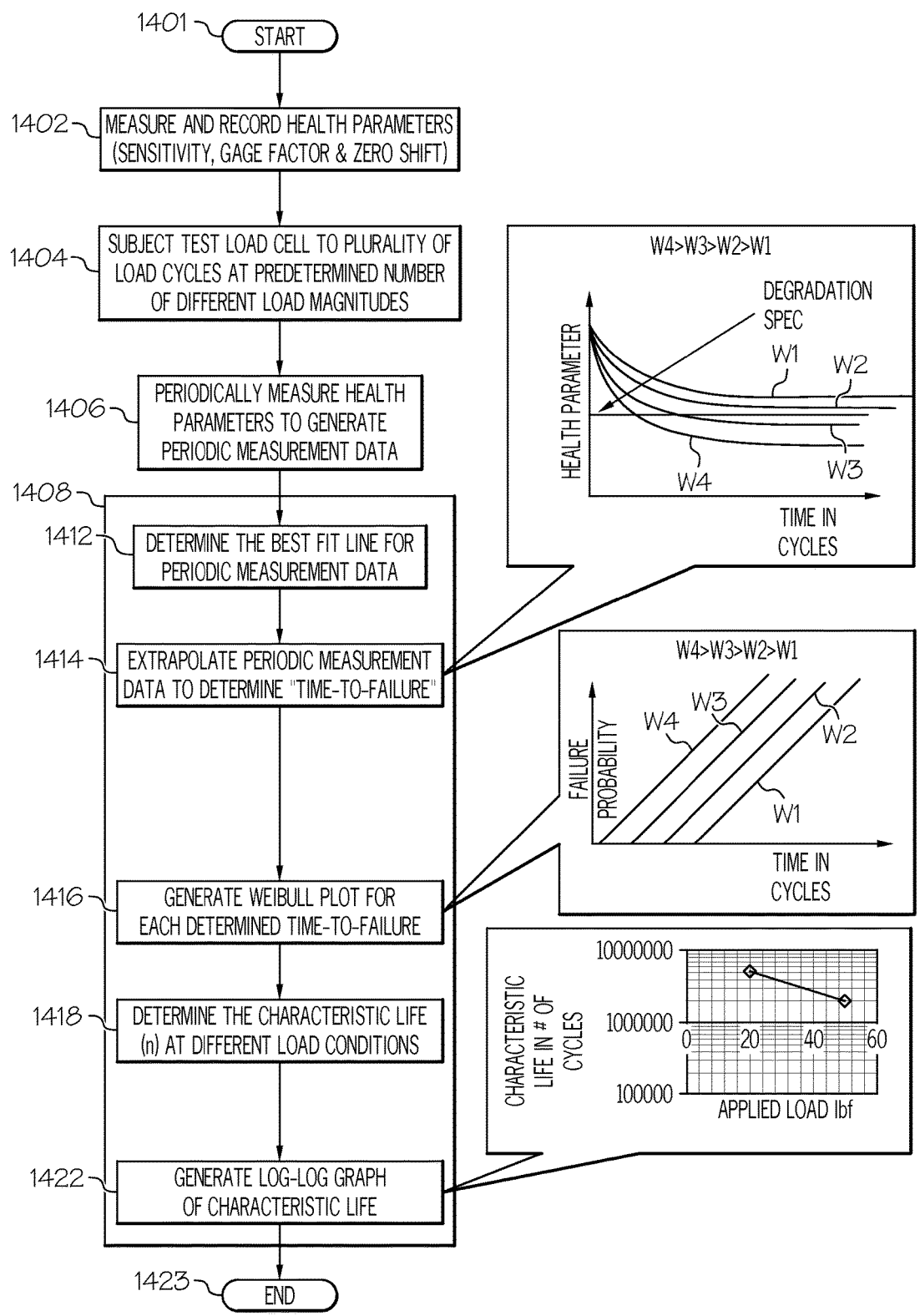
FIG. 14 depicts, in flowchart form, a process for generating fatigue life reference data associated with a load cell.

It was previously noted that the fatigue life reference data that are stored in the load cell database 104 are generated using a test load cell. For completeness, a particular preferred process for generating the fatigue life reference data will now be provided. In doing so, reference should now be made to FIG. 14, which shows that the process 1400 begins by measuring a predetermined number of health parameters of the test load cell (1402). The specific health parameters may vary, but preferably include, for example, sensitivity, gage factor, and zero shift, just to name a few.

No matter the specific health parameters, the test load cell is then subject to a plurality of load cycles at a plurality of different load magnitudes (1404). Although the number of different load magnitudes may vary, in a particular preferred embodiment at least three different magnitudes are used to provide improved prediction accuracy. While the test load cell is being subjected to a load cycle, each of the predetermined number of health parameters is periodically measured to generate periodic measurement data (1406). In one particular embodiment, the health parameters are initially measured every 1,000 cycles, and at a lesser periodicity over time. The fatigue life reference data are then generated based on the periodic measurement data (1408).

Although the fatigue life reference data may be variously generated, in the depicted embodiment this is done by determining a best-fit line for the periodic measurement data (1412), extrapolating the periodic measurement data to determine a time-to-failure for each of the different load magnitudes (1414), and generating a Weibull plot for each determined time-to-failure (1416). The fatigue life reference data are then from the generated Weibull plots by determining the characteristic life ($\eta$) at different load conditions (1418) and then generating a log-log graph of characteristic life (in number of cycles) versus applied load (1422).

The system and method described herein provides feedback to a user regarding the residual life of a load cell. The system and method provides this feedback based on the cumulative effect of randomly varying load peaks and load cycles, throughout the life of the load cell, and makes it available whenever a user makes a query for this information.

Those of skill in the art will appreciate that the various illustrative logical blocks, modules, circuits, and algorithm steps described in connection with the embodiments disclosed herein may be implemented as electronic hardware, computer software, or combinations of both. Some of the embodiments and implementations are described above in terms of functional and/or logical block components (or modules) and various processing steps. However, it should be appreciated that such block components (or modules) may be realized by any number of hardware, software, and/or firmware components configured to perform the specified functions. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention. For example, an embodiment of a system or a component may employ various integrated circuit components, e.g., memory elements, digital signal processing elements, logic elements, look-up tables, or the like, which may carry out a variety of functions under the control of one or more microprocessors or other control devices. In addition, those skilled in the art will appreciate that embodiments described herein are merely exemplary implementations.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In this document, relational terms such as first and second, and the like may be used solely to distinguish one entity or action from another entity or action without necessarily requiring or implying any actual such relationship or order between such entities or actions. Numerical ordinals such as "first," "second," "third," etc. simply denote different singles of a plurality and do not imply any order or sequence unless specifically defined by the claim language. The sequence of the text in any of the claims does not imply that process steps must be performed in a temporal or logical order according to such sequence unless it is specifically defined by the language of the claim. The process steps may be interchanged in any order without departing from the scope of the invention as long as such an interchange does not contradict the claim language and is not logically nonsensical.

Furthermore, depending on the context, words such as "connect" or "coupled to" used in describing a relationship between different elements do not imply that a direct physical connection must be made between these elements. For example, two elements may be connected to each other physically, electronically, logically, or in any other manner, through one or more additional elements.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A load cell residual fatigue life estimation system, comprising:
   an in-service load cell adapted to have loads applied thereto and configured, in response to the applied loads, to supply load cell output signals representative thereof;
   first memory having stored therein fatigue life reference data associated with a test load cell;
   second memory having stored therein a predetermined number of data storage bins, each data storage bin representative of a predefined value range of peak loads applied to the in-service load cell; and
   a first processor coupled to receive the load cell output signals and configured, upon receipt thereof, to:
      sample the in-service load cell output signals a predetermined number of times;
      determine a number of positive load peaks and a number of negative Load peaks there are in the predetermined number of samples;
      calculate an average amplitude magnitude of the positive load peaks;
      calculate an average amplitude magnitude of the negative load peaks;
      compare the calculated average amplitude magnitudes to determine which is a greater magnitude average load peak; and
      selectively store the determined number of positive load peaks or the determined number of negative load peaks in a data storage bin of the data storage bins associated with the greater magnitude average load peak; and
   a second processor in operable communication with the first memory and the second memory and configured to (i) calculate a number of load cycles of the in-service load cell based on the detected peak loads stored in each of the data storage bins and (ii) calculate an estimate of the residual life of the in-service load cell from the fatigue life reference data and the calculated number of load cycles of the in-service load cell.

2. The system of claim 1, wherein:
   the in-service load cell has a load limit range;
   the first processor is configured to sample the loads applied to the in-service load cell with a resolution of a predetermined number of bits; and
      the predefined value range of each data storage bin is the load limit range divided by 2 raised to a power of the predetermined number of bits.

3. The system of claim 2, wherein:
   the predetermined number of bits is equal to N; and
   the predetermined number of data storage bins is equal to $2^N$.

4. The system of claim 1, wherein the first processor is further configured to:
   compare the determined number of positive load peaks and the determined number of negative load peaks to determine which, if either, is greater;
   store the determined number of positive load peaks in the data storage bin associated with the greater magnitude average load peak when the determined number of positive load peaks is greater than the determined number of negative load peaks; and
   store the determined number of negative load peaks in the data storage bin associated with the greater magnitude average load peak when the determined number of negative load peaks is greater than the determined number of positive load peaks.

5. The system of claim 1, wherein the second processor is further configured to:
   determine if the estimate of the residual life of the in-service load cell is greater than a predetermined threshold.

6. The system of claim 5, further comprising:
   an annunciator coupled to receive an activation signal and configured, upon receipt thereof, to generate an annunciation signal,
   wherein the second processor is further configured to supply the activation signal when the estimate of the residual life of the in-service load cell is greater than the predetermined threshold.

7. The system of claim 1, wherein the second processor is further configured to generate usage pattern information.

8. A load cell residual fatigue life estimation system, comprising:
   an in-service load cell adapted to have loads applied thereto and configured, in response to the applied loads, to supply load cell output signals representative thereof;
   a first memory having stored therein fatigue life reference data associated with a test load cell;
   a second memory having stored therein a predetermined number of data storage bins, each data storage bin representative of a predefined value range of peak loads applied to the in-service load cell; and
   a first processor coupled to receive the load cell output signals and configured, upon receipt thereof, to:
      detect peak loads applied to an in-service load cell;
      determine a number of positive load peaks and a number of negative load peaks in the detected peak loads;
      calculate an average amplitude magnitude of the positive load peaks;
      calculate an average amplitude magnitude of the negative load peaks;
      compare the calculated average amplitude magnitudes to determine which is a greater magnitude average load peak; and
      selectively store the determined number of positive load peaks or the determined number of negative load peaks in a data storage bin of the data storage bins associated with the greater magnitude average load peak; and
   a second processor in signal communication with the first memory and the second memory and configured to:
   calculate a number of load cycles of the in-service load cell based on the detected peak loads stored in each of the data storage bins; and
   calculate an estimate of the residual life of the in-service load cell from the fatigue life reference data and the calculated number of load cycles of the in-service load cell.

9. The system of claim 8, wherein:
the in-service load cell has a load limit range;
the first processor is configured to sample the loads applied to the in-service load cell with a resolution of a predetermined number of bits; and
the predefined value range of each data storage bin is the load limit range divided by 2 raised to a power of the predetermined number of bits.

10. The system of claim 9, wherein:
the predetermined number of bits is equal to N; and
the predetermined number of data storage bins is equal to $2^N$.

11. The system of claim 8, wherein the first processor is further configured to:
compare the determined number of positive load peaks and the determined number of negative load peaks to determine which, if either, is greater;
store the determined number of positive load peaks in the data storage bin associated with the greater magnitude average load peak when the determined number of positive load peaks is greater than the determined number of negative load peaks; and
store the determined number of negative load peaks in the data storage bin associated with the greater magnitude average load peak when the determined number of negative load peaks is greater than the determined number of positive load peaks.

12. The system of claim 8, wherein the second processor is further configured to:
determine if the estimate of the residual life of the in-service load cell is greater than a predetermined threshold.

13. The system of claim 12, further comprising:
an annunciator coupled to receive an activation signal and configured, upon receipt thereof, to generate an annunciation signal,
wherein the second processor is further configured to supply the activation signal when the estimate of the residual life of the in-service load cell is greater than the predetermined threshold.

14. The system of claim 8, wherein the second processor is further configured to generate usage pattern information.

15. A load cell residual life estimation system, comprising:
an in-service load cell adapted to have loads applied thereto and configured, in response to the applied loads, to supply load cell output signals representative thereof;
first memory having stored therein fatigue life reference data associated with a test load cell, wherein the fatigue life reference data characterizes a number of cycles in a characteristic life of the test load cell relative to an applied load magnitude;
second memory having stored therein a predetermined number of data storage bins, each data storage bin of the predetermined number of data storage bins is representative of a predefined value range of peak loads applied to the in-service load cell across a load limit range of the in-service load cell; and
a first processor coupled to receive the load cell output signals and configured, upon receipt thereof, to: (i) detect peak loads applied to the in-service load cell, wherein the peak loads represent load peaks measured by the in-service load cell during use, and (ii) store each of the detected peak loads in an appropriate one of the data storage bins having a peak load range corresponding to the detected peak loads; and
a second processor in operable communication with the first memory and the second memory and configured to (i) calculate a number of load cycles of the in-service load cell based on a number of load peaks in the detected peak loads stored in each of the data storage bins and (ii) calculate an estimate of the residual life of the in-service load cell from the number of cycles in the characteristic life in the fatigue life reference data and the calculated number of load cycles of the in-service load cell.

16. The system of claim 15, wherein:
the first processor is configured to sample the loads applied to the in-service load cell with a resolution of a predetermined number of bits; and
the predefined value range of each data storage bin is the load limit range divided by 2 raised to a power of the predetermined number of bits.

17. The system of claim 16, wherein the first processor is further configured to:
sample the in-service load cell output a predetermined number of times;
determine a number of positive load peaks and a number of negative load peaks there are in the predetermined number of samples;
calculate an average amplitude magnitude of the positive load peaks;
calculate an average amplitude magnitude of the negative load peaks;
compare the calculated average amplitude magnitudes to determine which is a greater magnitude average load peak; and
selectively store the determined number of positive load peaks or the determined number of negative load peaks in the data storage bin associated with the greater magnitude average load peak.

18. The system of claim 17, wherein the first processor is further configured to:
compare the determined number of positive load peaks and the determined number of negative load peaks to determine which, if either, is greater;
store the determined number of positive load peaks in the data storage bin associated with the greater magnitude average load peak when the determined number of positive load peaks is greater than the determined number of negative load peaks; and
store the determined number of negative load peaks in the data storage bin associated with the greater magnitude average load peak when the determined number of negative load peaks is greater than the determined number of positive load peaks.

19. The system of claim 15, wherein the second processor is further configured to:
determine if the estimate of the residual life of the in-service load cell is greater than a predetermined threshold.

* * * * *

UNITED STATES PATENT AND TRADEMARK OFFICE
CERTIFICATE OF CORRECTION

PATENT NO. : 9,638,756 B2  
APPLICATION NO. : 13/710618  
DATED : May 2, 2017  
INVENTOR(S) : Srinivasan et al.

Page 1 of 1

It is certified that error appears in the above-identified patent and that said Letters Patent is hereby corrected as shown below:

In the Claims

Column 9, Line 32 Claim 1: "Load" should read "load"

Signed and Sealed this  
Seventeenth Day of October, 2017

Joseph Matal  
*Performing the Functions and Duties of the*  
*Under Secretary of Commerce for Intellectual Property and*  
*Director of the United States Patent and Trademark Office*